United States Patent [19]
Orban

[11] Patent Number: 5,282,252
[45] Date of Patent: Jan. 25, 1994

[54] AUDIO EQUALIZER PROVIDING RECIPROCAL EQUALIZATION PLUS INFINITE-DEPTH NOTCH

[75] Inventor: Robert A. Orban, Belmont, Calif.

[73] Assignee: AKG Acoustics, Inc., San Francisco, Calif.

[21] Appl. No.: 842,466

[22] Filed: Feb. 27, 1992

[51] Int. Cl.⁵ .......................... H03G 5/00; H03H 5/00
[52] U.S. Cl. ...................... 381/98; 333/28 T
[58] Field of Search .............. 381/98, 103; 333/28 R, 333/28 T

[56] References Cited
U.S. PATENT DOCUMENTS
4,336,501  6/1982  Ishikawa et al. .................. 333/28 R

Primary Examiner—Jin F. Ng
Assistant Examiner—P. W. Lee
Attorney, Agent, or Firm—Blakely, Sokoloff, Taylor & Zafman

[57] ABSTRACT

Audio equalizer circuit for adjusting the amount of boost and cut. The circuit uses a combination negative feedback, positive feedback, negative feed-forward and positive feed-forward resulting in boost and cut characteristics which are entirely reciprocal and which, nonetheless provides an infinite-depth notch. The equalizer is fabricated with an ordinary band pass filter, resistors, potentiometer and operational amplifiers.

15 Claims, 3 Drawing Sheets

FIG_1 (PRIOR ART)

FIG_2 (PRIOR ART)

FIG_3

FIG_6

AUDIO EQUALIZER PROVIDING RECIPROCAL EQUALIZATION PLUS INFINITE-DEPTH NOTCH

BACKGROUND OF THE INVENTION

1. Field of the Invention

The invention relates to the field of audio equalizers and tone control.

2. Prior Art

Audio equalizers are well-known in the art for boosting and cutting predetermined frequency ranges or bands. Ideally, an equalizer should have reciprocal, mirror image characteristics for boosting when compared to cutting. Moreover, an ideal equalizer should provide an infinite-depth notch.

Ideal equalizers, if connected in cascade, should be capable of providing a flat, a overall complex gain response since the boosting of one equalizer should exactly cancel the cutting of the other. Looked at in another way, the first equalizer's frequency response precisely complements the second's, and cancels out the effect of the first equalizer. To have this reciprocity, the zeros of one equalizer must equal the poles of the other equalizer and vice-versa. (The complex gain is generally described as a function of the Laplace transform complex variable "s", as is well-known in the art. In the description which follows, the "poles" and "zeros" refer to the poles and zeros of transmission, respectively.)

Many equalizers well-known in the art achieve equalization by combining the output of a filter with the filter's input to amplify or attenuate signals in a frequency-selective way. If the filter is a first-order low-pass filter [having a complex gain function of the form $p/(s+p)$], it produces a so-called "low-pass shelving" characteristic. If the filter is a first-order high pass filter [having a complex gain function of the form $s/(s+p)$], it produces a so-called "high-pass shelving" characteristic. If the filter is a second-order band-pass filter [having a complex gain function of the form $Qs/(s^2 \cdot Qs + \omega_o)$], it produces a so-called "peaking" or "dipping" characteristic, with associated bell-shaped curves of gain versus frequency.

Figure 1:
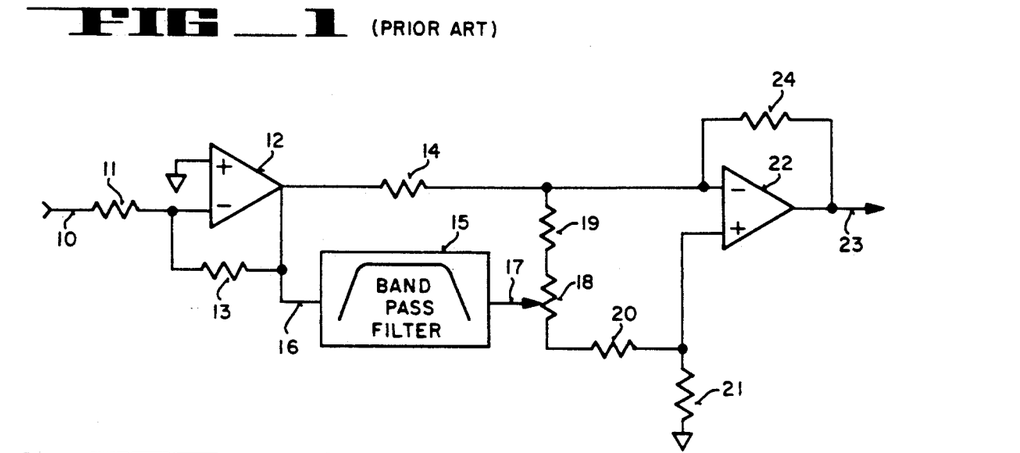
FIG. 1 is an electrical schematic illustrating a prior art equalizer.
Figure 2:
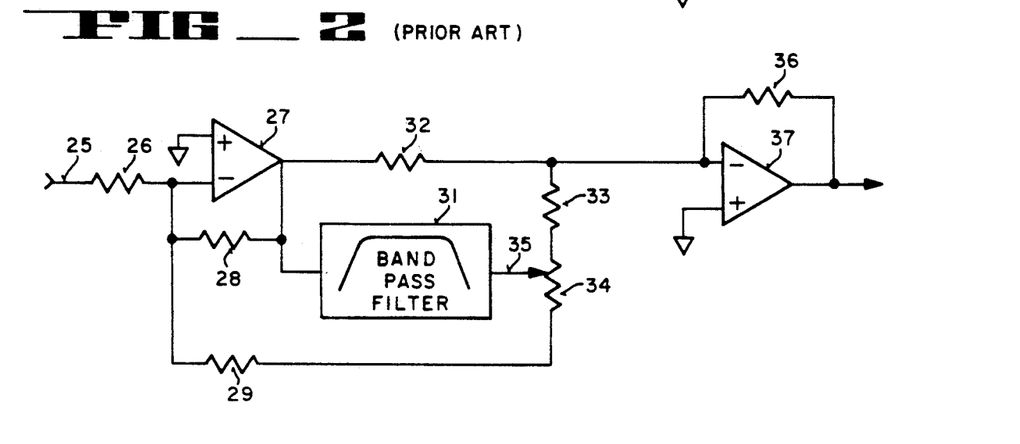
FIG. 2 is an electrical schematic illustrating another prior art equalizer.

There are two widely used circuits for combining the output of the filter with its input to achieve the equalization. These circuits are shown in FIGS. 1 and 2 and are subsequently discussed in conjunction with these figures.

As will be seen, the present invention provides improved characteristics in that the boosting and cutting are reciprocal and since an infinite-depth cut is obtained.

SUMMARY OF THE INVENTION

In the currently preferred embodiment, the audio equalizer receives an input audio signal which is coupled to a first operational amplifier. The output of the amplifier is coupled to a band pass filter and to a second operational amplifier. A positive feed-forward path couples the output of the filter to the input audio signal at the input to the second operational amplifier. A positive feedback path coupled the output of the filter to the input signal at the input of the first amplifier. A negative feedback path couples that output of the filter to the input signal at the input of the first amplifier. A negative feed-forward path couples the output of the filter to the input of the second amplifier. This results in a equalizer that has reciprocal characteristics and which provides an infinite-depth cut.

DETAILED DESCRIPTION OF THE PRESENT INVENTION

An audio equalizer is described which provides reciprocal characteristics and an infinite-depth cut. In the following description, numerous specific details are set forth, such as specific resistance values, in order to provide a thorough understanding of the present invention. It will be obvious to one skilled in the art that the present invention may be practiced without these specific details. In other instances, well-known structures, such as operational amplifiers and band pass filters, have not be described in detail in order not to unnecessarily obscure the present invention.

PRIOR ART OF FIGS. 1 AND 2

In FIG. 1 one version of a prior art equalizer is shown having a band pass filter 15 and operational amplifiers 12 and 22. An input audio signal is coupled from line 10 through resistor 11 to the negative input terminal of the amplifier 12. The output of the amplifier 12 is coupled to amplifier 22 via the resistor 14. The output of the band pass filter 15 is coupled to a wiper 17 of a potentiometer 18. The potentiometer provides a positive feed-forward path through resistor 19 and a negative feed-forward path through the attenuator comprising resistors 20 and 21. Negative feedback is provided for each of the amplifiers; specifically, resistor 13 provides negative feedback for amplifier 12 and resistor 24 provides negative feedback for amplifier 22. The equalized audio signal is provided on the line 23.

In effect, the circuit of FIG. 1 adds the output of the filter to its input to obtain a peaking boost and subtracts the output of the filter from its input to achieve a dipping cut. This type of structure is generally referred to as "additive". The poles of the complex gain function formed by the addition or subtraction do not change regardless of the amount of equalization employed. Such an arrangement cannot produce reciprocal equalizer characteristic curves because the location of the poles does not change in the cut mode. The principal advantage of an additive equalizer is that it can easily produce an infinite-depth of cut because the cut is achieved by a cancellation between the filter's input and its output.

The prior art equalizer of FIG. 2 again includes a pair of operational amplifiers 27 and 37. The input audio signal on line 25 is coupled through resistor 26 to the negative input terminal of the amplifier 27. The output of the band pass filter 31 is coupled to a wiper 35 of the potentiometer 34. The output of amplifier 27 is summed with the filter's output through the resistors 32 and 33, and the sum signal is coupled to the negative input terminal of the amplifier 37. Negative feedback is provided from the output of the filter through resistor 29. Once again negative feedback is provided for amplifiers 27 and 37 through resistors 28 and 36, respectively.

The equalizer of FIG. 2 has reciprocal characteristics. This is achieved by adding the output of a filter to its input, as in the case of an "additive" equalizer. However, cutting is achieved not by subtraction, but by negative feedback. By feeding the output of the filter back into the input of its driving amplifier to produce negative feedback, the circuit creates cut curves that are precisely reciprocal to the boost curves. In doing so, it changes the location of the poles of the overall complex gain function of the equalizer.

The major disadvantage of the circuit of FIG. 2 is that it cannot produce an infinite-depth cut at any frequency because this would require the gain of the feedback path to be infinite. In turn, this would cause the overall equalizer to have no gain at any frequency because the feedback gain would be infinite at any frequency at which the filter had a finite amount of transmission. With either the first-order or second-order filters considered, this would be any frequency other than zero or infinity. In essence, the Q of the circuit would tend asymptotically towards O as the amount of cutting equalization was increased.

CURRENTLY PREFERRED EMBODIMENT OF THE PRESENT INVENTION

Figure 3:
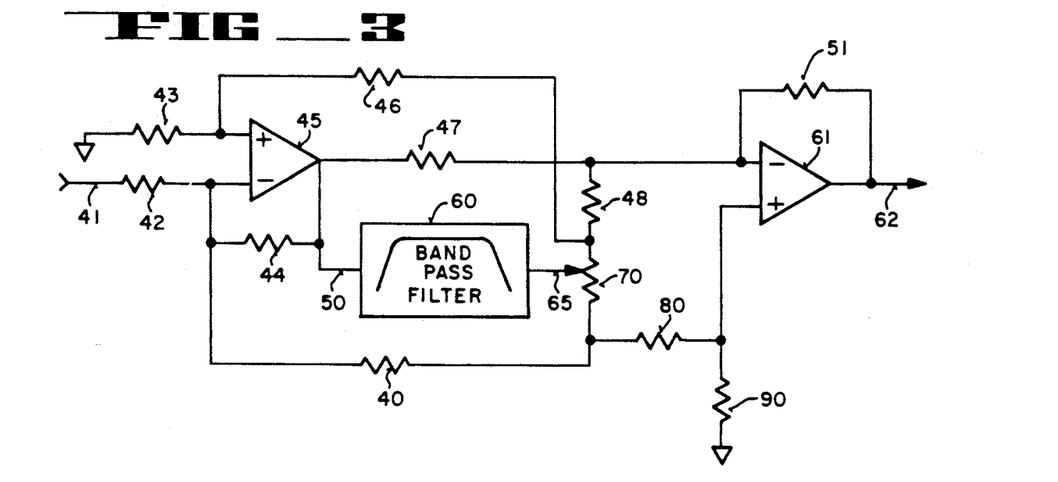
FIG. 3 is an electrical schematic of an equalizer built in accordance with the currently preferred embodiment of the present invention.

Referring to FIG. 3 the currently preferred embodiment of the present invention is illustrated. The input audio signal on line 41 is coupled through a resistor 42 to the negative input terminal of an operational amplifier 45. The other input terminal of this amplifier is coupled to ground through a resistor 43. The output of amplifier 45 (the input audio signal, node 50) is coupled to the input of a band pass filter 60. The output of the filter is coupled to a wiper 65 of a potentiometer 70. The output of the amplifier 45 is combined with the output of the filter through resistors 47 and 48, with the sum signal being coupled to the negative input terminal of an operational amplifier 61. Accordingly, the resistor 48 provides a positive feed-forward path from the output of the filter 60.

The potentiometer 70 is also coupled to the negative input terminal of the amplifier 45 through a resistor 40. Resistor 40 provides negative feedback of the output of the filter to the input audio signal. Negative feed-forward is provided from the potentiometer 70 through the attenuator comprising resistors 80 and 90. The common junction between these resistors is coupled to the positive input terminal of amplifier 61. Positive feedback from the output of the filter is provided through resistor 46. This resistor is coupled between the common connection between resistor 48 and potentiometer 70, and the positive input terminal of the amplifier 45.

Negative feedback for amplifier 45 is provided by resistor 44 and similarly, negative feedback for amplifier 61 is provided by resistor 51 which couples the output line 62 to the negative input terminal of the amplifier 61.

In FIG. 3, the signal to be equalized is applied to line 41 and thence to the inverting input of operational amplifier 45 through resistor 42 as shown. (Amplifier 45 and its companion amplifier 61 can be any high-quality operational amplifier like the NE5532, manufactured by Signetics.)

Filter 60 which receives the input audio signal can be any filter with infinite attenuation at O Hz, x Hz, or both O Hz and x Hz. To avoid undesired secondary dips or peaks in the response and to ensure that the equalization curves are symmetrical with respect to frequency, the filter's phase shift should not exceed ±90° at any frequency and should be 0° at its frequency of maximum gain. The most useful practical filters are first-order low-pass filters (producing a so-called "low-pass shelving" characteristic), first-order high-pass filters (producing a so-called "high-pass" shelving" characteristic), and second-order band pass filters (producing a so-called "peaking" or "dipping" characteristic, with associated bell-shaped curves of gain versus frequency). All of these filters can be realized by passive or active means and are well-known in the art. (For example, see: Arthur B. Williams, *Electronic Filter Design Handbook*, New York, McGraw-Hill, 1981.)

The output of filter 60 is applied to the wiper 65 of potentiometer 70, the "equalization" control. (In the currently preferred embodiment, potentiometer 70 has a linear taper.) The user adjusts this control to select the amount of equalization. The equalized output signal appears on line 62 with the equalizer's performance characteristics being shown in FIG. 6. When the wiper of potentiometer 70 is moved toward resistor 48, boosting occurs (upper part of FIG. 6) because the output of filter 60 is summed with its input signal in amplifier 61. Additionally, more positive feedback is applied to amplifier 45 through the attenuator formed by resistors 43 and 46.

When the wiper of potentiometer 70 is moved towards resistor 80, cutting occurs (as shown in the lower part of FIG. 6) because more of the output of filter 60 is applied to the input to amplifier 45 through resistor 40 so as to produce more negative feedback. Additionally, more negative feed-forward is applied to amplifier 61 through the attenuator formed by resistors 80 and 90, which increases the amount of cutting. This path provides the infinite cut if the gain of this attenuator is correctly chosen as is discussed below.

This circuit of FIG. 3 operates according to the goals of the invention when the values of the resistor are chosen as discussed below. While the operation of this circuit is relatively easy to describe qualitatively, it is very difficult to analyze mathematically because of the multiple positive and negative feedback loops; note, virtually every part of this circuit is coupled to every other part. Nevertheless, a straightforward (but very lengthy and tedious) nodal analysis yields the complex gain of the circuit as a function of the position of the wiper of potentiometer 70, the resistor values, and the complex gain function of the filter 60. Given the desired behavior of potentiometer 70 as a function of its rotation, one can then write a number of simultaneous non-linear equations for the fixed resistors. These equations and their solution with the currently preferred values of the resistors are attached as Appendix A. These equations can be solved numerically on a digital computer by algorithms well-known in the art (like the public domain program MINPACK from Argonne National Laboratories) to obtain the resistor values.

For example, if one expresses the rotation of potentiometer 70 as k, where k=O at potentiometer 70's bottom end-stop and k=1 at potentiometer 70's top end-stop, the following equations can be written;

1) At k=1 the peak gain of the circuit is 16dB.
2) At k=0.75, the peak gain of the circuit is 4dB.
3) At k=0.5 (the mid-rotation point), the peak gain of the circuit is 0dB.
4) At k=0, the peak gain of the circuit is 0 ($-\infty$dB).
5) At k=k1 (where k1 is unknown), the peak gain of the circuit is $-16$dB.
6) At k=1, the Q of the s-plane zeros of the circuit is equal to the Q of the s-plane poles of the circuit at k=k1. (This establishes the reciprocal characteristic.)

Consequently, there are six equations for seven unknown resistors, indicating that the designer can choose one characteristic arbitrarily. The useful characteristic to adjust is the gain of the attenuator formed by resistors 46 and 43, which determines the amount of positive feedback. The greater the attenuation, the less positive feedback is applied to amplifier 45, and the less the poles move as k is varied. The designer can thus control this important characteristic of the circuit by choosing this attenuation before solving the other equations.

Appendix A sets forth the specific equations for a nodal analysis of the circuit of FIG. 3 and provides a solution to the equations yielding specific resistor values. The table at the end of the appendix sets forth the commercial values or "practical values" for the resistors 40, 42, 43, 44, 46, 47, 48, 51, 70, 80 and 90.

Figure 6:
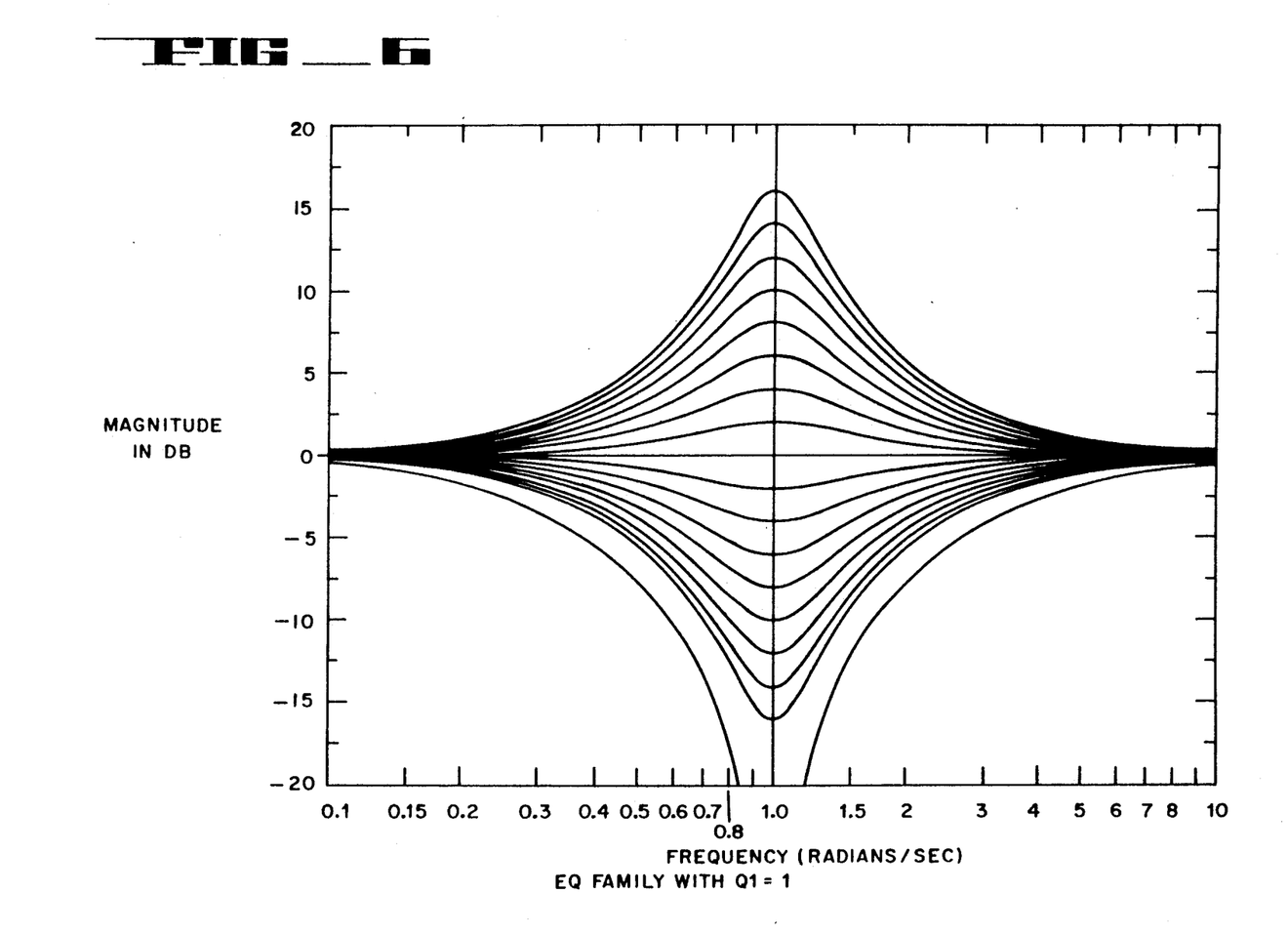
FIG. 6 illustrates a plurality of curves each for a different potentiometer setting showing the characteristics of the equalizer of FIG. 3.

FIG. 6 illustrates the characteristics of the circuit of FIG. 3. In FIG. 6, the mirror image or reciprocal nature of the curves about the 0dB line can be seen. Note that the cut extends to, in effect, $-\infty$ providing the deep notch.

ALTERNATE EMBODIMENTS

Figure 4:
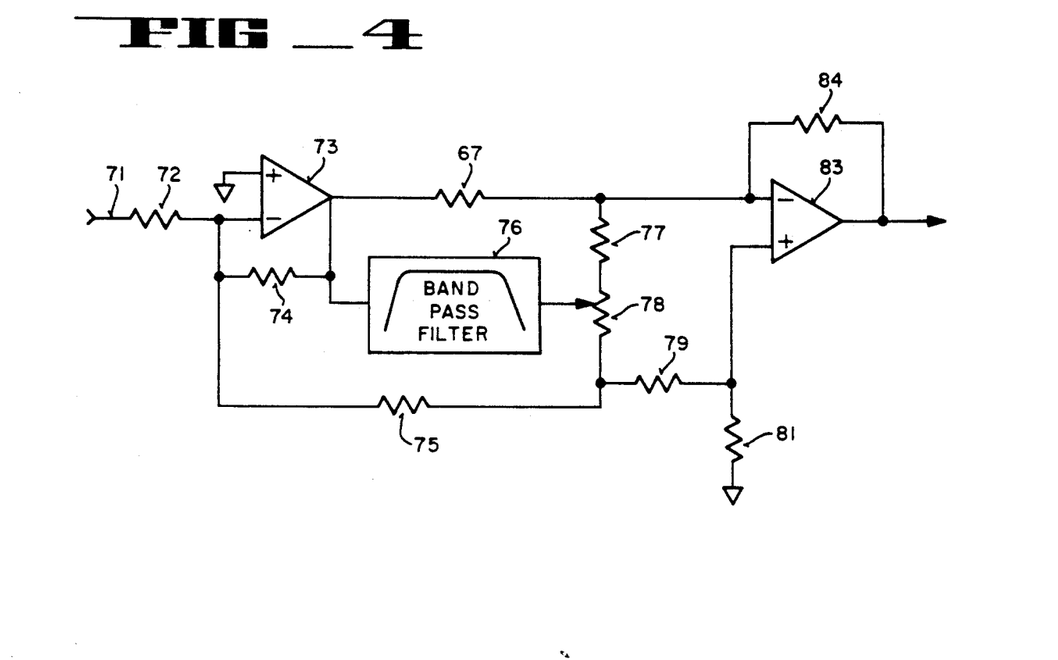
FIG. 4 is an electrical schematic illustrating an alternate embodiment of the present invention.

FIG. 4 illustrates an alternate embodiment of the present invention. Once, again, there are two operational amplifiers 73 and 83 and an input line 71 which supplies the input audio signal through a resistor 72 to the amplifier 73. Again, there is negative feedback for the amplifiers as shown by resistors 74 and 84. The amplifiers are interconnected by the resistor 67 with a positive feed-forward path from the filter 76 through the potentiometer 78 and resistor 77. The negative feedforward is provided through the resistors 79 and 81. Also, a negative feedback path is provided from the output of the filter through the resistor 75. This embodiment does not have the positive feedback path of the preferred embodiment.

In the circuit of FIG. 3, the negative feed-forward path assures the infinite cut, however, the high degree of reciprocity shown in FIG. 6 is lost since the cut curves become narrower than the boost curves. Nonetheless, the characteristic curves of the circuit of FIG. 4 are much closer to being truly reciprocal than are the curves produced by the additive circuit of FIG. 1.

Figure 5:
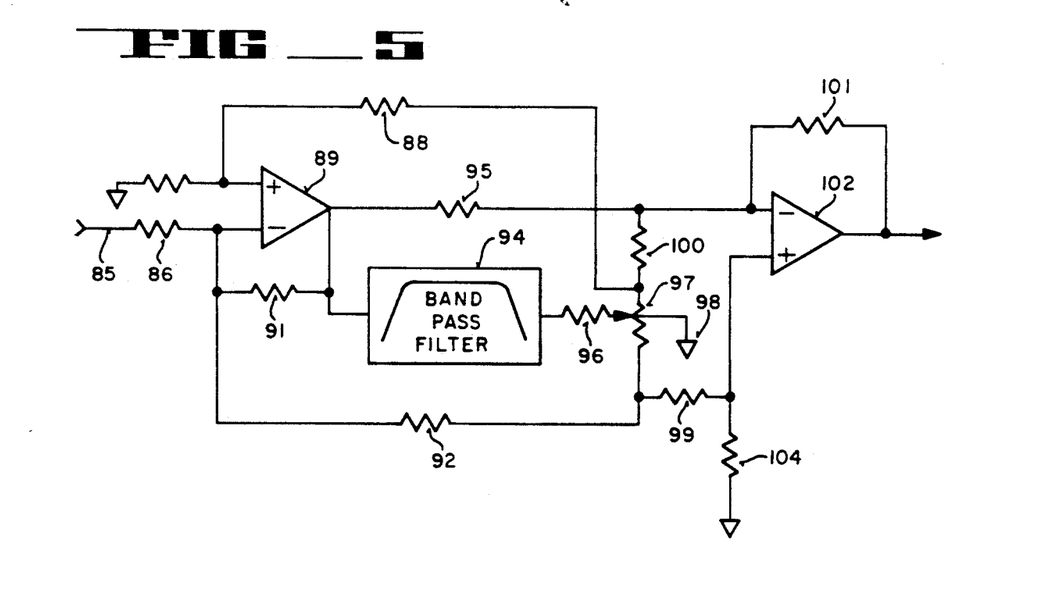
FIG. 5 is an electrical schematic illustrating another alternate embodiment of the present invention.

FIG. 5 illustrates another alternate embodiment. Once again two operational amplifiers, 89 and 102 are used. The input audio signal is coupled from a line 85 through resistor 86 to amplifier 89. Amplifier 89 is coupled to amplifier 102 by the resistor 95. Positive feed-forward is provided through resistor 100, negative feed-forward through resistors 99 and 104, negative feedback through resistor 92 and positive feedback through resistor 88. The amplifiers again have negative feedback through resistors 91 and 101.

Unlike the embodiment of FIG. 3, however, the output of the band pass filter 94 is coupled through a resistor 96 to a center tapped potentiometer 97. The center tap 98 of potentiometer 97 is grounded.

The advantages to the embodiment of FIG. 5 result from the fact that the grounded center tap guarantees that the equalizer will have flat response at k=0.5 since the output of the filter is grounded. It, however, has several disadvantages. Mainly the potentiometer is more costly, the equalization versus k curves are not as well behaved as they are for the embodiment of FIG. 3 and finally, the filter 94 must supply more current when k=0.5 because resistor 96 is needed. Note resistor 96 is needed since at k=0.5 current from the filter is limited only by resistor 96.

The operation of the circuit of FIG. 5 is conceptually identical to that of the operation of the circuit of FIG. 3.

Thus, a novel equalizer circuit that has reciprocal curves throughout the range where the peak cut is equal to or less than the maximum peak boost, yet which can achieve an infinite notch, has been described. Two alternate embodiments have also been described including one with a center tapped potentiometer.

APPENDIX A

1: "EQUALIZER CONTROL WITHOUT GROUNDED CENTER TAP"
2: "Embodiment of FIG. 3"
3: "gain as a function of '$k$':"
4: "Get expression of overall equalizer gain as a function of '$k$'"
5: "where '$k$' is rotation of boost/cut control;"
6: "$k = 0$ for full cut; $k = 1$ for full boost"
7: "We express resistances as their reciprocals (i.e., admittances) to simplify the algebra."
8: "So $gn = 1/rn$."
9: "To further simplify the algebra, we define $n = r6/r7$ and $m = r9/r10$. So"
10: $r6 = nr7$
11: $r5 = r7(1 - n)$
12: $r9 = mr10$
13: $r8 = r10(1 - m)$
14: "Write nodal admittance equations for EQ circuit; express as vector of equations:"

15: $\left[ g2(e - nv4) + g2(v3 - nv4) + g3(v2 - nv4), g3(nv4 - v2) + \frac{1}{k}(bv3 - v2) + \right.$ $\left. g10(-v2), \frac{1}{1-k}(bv3 - v4) + g4(mv2 - v4) + g7(-v4), g2(v3 - mv2) + g2(1 - mv2) + g4(v4 - mv2) \right]$ 16: "Overall gain of circuit, where '$b$' is complex gain of bandpass filter:"

-continued
APPENDIX A

17: $-\dfrac{b(k(mr10(nr7(r2 + 2r4) - r3(r2 + 2(r4 + r7))) - r2r7(r10 + r3)) + r10r3(m(r2(r7 + 1) + 2(r4(r7 + 1) + r7)) - r2r7) - (k^2(mnr10r7 - (r4 + r7)(r10 + r3)) - k(mnr10r7 + r10(r3(r4 + r7) - (r4(r7 + 1) + r7)) - r3(r4(r7 + 1) + r7)) + r10r3(r4(r7 + 1) + r7))}{b(k(mnr10r7(r2 + 2r3) - (nr4r7(2r10 + r2 + 2r3) + r10r2(r4 + r7))) - r10(mnr7(r2 + 2r3) + nr4r7(r2 + 2r3) - r2(r4(r7 + 1) + r7))) + k^2(mnr10r7 - (r4 + r7)(r10 + r3)) - k(mnr10r7 + r10(r3(r4 + r7) - (r4(r7 + 1) + r7)) - r3(r4(r7 + 1) + r7)) + r10r3(r4(r7 + 1) + r7)}$ 18: "For convenience, let peak frequency = 1."

19: "Then express complex gain of bandpass filter (b) as:"

20: $\dfrac{q1s}{s^2 + q1s + 1}$

21: "(Note that 'q1' is the inverse of the usual definition of 'q')"
22: "The numerator of overall gain function becomes"
23: $s^2(k^2(mnr10r7 - (r4 + r7)(r10 + r3)) - k(mnr10r7 + r10(r3(r4 + r7) - (r4(r7 + 1) + r7)) - r3(r4(r7 + 1) + r7)) + r10r3(r4(r7 + 1) + r7)) + sq1(k^2(mnr10r7 - (r4 + r7)(r10 + r3)) + k(r10(r2r7 + (r4(r7 + 1) + r7) - r3(r4 + r7)) + r3(r2r7 + r4(r7 + 1) + r7) - mr10(nr7(r2 + 2r4 + 1) - r3(r2 + 2(r4 + r7)))) - r10r3(m(r2(r7 + 1) + 2(r4(r7 + 1) + r7)) - (r2r7 + r4(r7 + 1) + r7))) + k^2(mnr10r7 - (r4 + r7)(r10 + r3)) - k(mnr10r7 + r10(r3(r4 + r7) - (r4(r7 + 1) + r7)) - r3(r4(r7 + 1) + r7)) + r10r3(r4(r7 + 1) + r7)$ 24: "denomonator:"
25: $s^2(k^2(mnr10r7 - r10(r4 + r7) - r3(r4 + r7)) - k(mnr10r7 + r10(r3(r4 + r7) - (r4(r7 + 1) + r7)) - r3(r4(r7 + 1) + r7)) + r10r3(r4(r7 + 1) + r7)) + q1s(k^2(mnr10r7 - (r4 + r7)(r10 + r3)) + k(mnr10r7(r2 + 2r3 - 1) - nr4r7(2r10 + r2 + 2r3) + r10(r2(r4 + r7) + r3(r4 + r7) - (r4(r7 + 1) + r7)) + r3(r4(r7 + 1) + r7)) - r10(mnr7(r2 + 2r3) + nr4r7(r2 + 2r3) - (r4(r7 + 1) + r7)(r2 + r3))) + k^2(mnr10r7 - r10(r4 + r7) - r3(r4 + r7)) - k(mnr10r7 + r10(r3(r4 + r7) - (r4(r7 + 1) + r7)) - r3(r4(r7 + 1) + r7)) + r10r3(r4(r7 + 1) + r7)$ 26: "If the numerator is of the form $s^2 + d1s + 1$, then 'd1' is the 'damping'."
27: "get damping of numerator:"

28: $s^2 + \dfrac{q1s(k^2(mnr10r7 - (r4 + r7)(r10 + r3)) + k(r10(r2r7 + (r4(r7 + 1) + r7) - r3(r4 + r7)) + r3(r2r7 + r4(r7 + 1) + r7) - mr10(nr7(r2 + 2r4 + 1) - r3(r2 + 2(r4 + r7)))) - r10r3(m(r2(r7 + 1) + 2(r4(r7 + 1) + r7)) - (r2r7 + r4(r7 + 1) + r7)))}{k^2(mnr10r7 - (r4 + r7)(r10 + r3)) - k(mnr10r7 + r10(r3(r4 + r7) - (r4(r7 + 1) + r7)) - r3(r4(r7 + 1) + r7)) + r10r3(r4(r7 + 1) + r7)} + 1$ 29: "damping of numerator:"

30: $\dfrac{q1(k^2(mnr10r7 - (r4 + r7)(r10 + r3)) + k(r10(r2r7 + (r4(r7 + 1) + r7) - r3(r4 + r7)) + r3(r2r7 + r4(r7 + 1) + r7) - mr10(nr7(r2 + 2r4 + 1) - r3(r2 + 2(r4 + r7)))) - r10r3(m(r2(r7 + 1) + 2(r4(r7 + 1) + r7)) - (r2r7 + r4(r7 + 1) + r7)))}{k^2(mnr10r7 - (r4 + r7)(r10 + r3)) - k(mnr10r7 + r10(r3(r4 + r7) - (r4(r7 + 1) + r7)) - r3(r4(r7 + 1) + r7)) + r10r3(r4(r7 + 1) + r7)}$ 31: "get damping of denomonator:"

32: $s^2 + \dfrac{q1s(k^2(mnr10r7 - (r4 + r7)(r10 + r3)) + k(mnr10r7(r2 + 2r3 - 1) - (nr4r7(2r10 + r2 + 2r3) + r10(r2(r4 + r7) + r3(r4 + r7) - (r4(r7 + 1) + r7)) - r3(r4(r7 + 1) + r7))) - r10(mnr7(r2 + 2r3) + nr4r7(r2 + 2r3) - (r4(r7 + 1) + r7)(r2 + r3)))}{k^2(mnr10r7 - (r4 + r7)(r10 + r3)) - k(mnr10r7 + r10(r3(r4 + r7) - (r4(r7 + 1) + r7)) - r3(r4(r7 + 1) + r7)) + r10r3(r4(r7 + 1) + r7)} + 1$ 33: "damping of denomonator:"

34: $q1\dfrac{k^2(mnr10r7 - (r4 + r7)(r10 + r3)) + k(mnr10r7(r2 + 2r3 - 1) - (nr4r7(2r10 + r2 + 2r3) + r10(r2(r4 + r7) + r3(r4 + r7) - (r4(r7 + 1) + r7)) - r3(r4(r7 + 1) + r7))) - r10(mnr7(r2 + 2r3) + nr4r7(r2 + 2r3) - (r4(r7 + 1) + r7)(r2 + r3))}{k^2(mnr10r7 - (r4 + r7)(r10 + r3)) - k(mnr10r7 + r10(r3(r4 + r7) - (r4(r7 + 1) + r7)) - r3(r4(r7 + 1) + r7)) + r10r3(r4(r7 + 1) + r7)}$ 35: "==========================================="
36: "Write six simultaneous non-linear equations for numerical solution by 'Minpak' routine"
37: "We assume that the complex gain of the bandpass filter 'b' at its peak frequency"
38: "is $1 + j0$. We therefore replace 'b' by '1' in Eq. 17 to get the peak gain."
39: "To write the first five equations, we substitute the appropriate"
40: "value of 'k' (the EQ control rotation) into Eq. 17, and set the result equal to the desired peak gain."
41: "16dB boost at $k = 1$:"

-continued
APPENDIX A

42: $6.30957 = \dfrac{mr10(r2 + 2r4)(n + r3) - (r2 + r4)(r10(r3 + 1) + r3)}{r4(n(r10(r2 + 2(r3 + 1)) + r2 + 2r3) - (r10(r2 + r3 + 1) + r3))}$ 43: "4dB boost at $k = 0.75$:"

44: $1.58489 = \dfrac{mr10(3nr7(4r2 + 8r4 + 1) + 4r3(r2(4r7 + 1) + 2(r4(4r7 + 1) + r7))) -}{mnr10r7(4r2 + 8r3 + 3) + 4nr4r7(2r10(2r2 + 4r3 + 3) + 3(r2 + 2r3)) -}$ $\dfrac{(4r2r7 + r4(4r7 + 1) + r7)(r10(4r3 + 3) + 3r3)}{(r4(4r7 + 1) + r7)(r10(4r2 + 4r3 + 3) + 3r3)}$ 45: "flat response at $k = 0.5$:"

46: $1 = \dfrac{mr10(nr7(2r2 + 4r4 + 1) + 2r3(r2(2r7 + 1) + 2(r4(2r7 + 1) + r7))) -}{mnr10r7(2r2 + 4r3 + 1) + 2nr4r7(2r10(r2 + 2r3 + 1) + r2 + 2r3) -}$ $\dfrac{(2r2r7 + r4(2r7 + 1) + r7)(r10(2r3 + 1) + 3r3)}{(r4(2r7 + 1) + r7)(r10(2r2 + 2r3 + 1) + r3)}$ 47: "infinite cut at $k = 0$:"

48: $0 = \dfrac{r3(m(r2(r7 + 1) + 2(r4(r7 + 1) + r7)) - (r2r7 + r4(r7 + 1) + r7))}{mnr7(r2 + 2r3) + nr4r7(r2 + 2r3) - (r4(r7 + 1) + r7)(r2 + r3)}$ 49: "16dB cut at presently unknown '$k$':"

50: $0.158489 = \dfrac{k^2(mnr10r7 - (r4 + r7)(r10 + r3)) + k(r10(r2r7 + (r4(r7 + 1) + r7) - r3(r4 + r7)) +}{k^2(mnr10r7 - (r4 + r7)(r10 + r3)) + k(mnr10r7(r2 + 2r3 - 1) - (nr4r7(2r10 + r2 + 2r3) +}$ $\dfrac{r3(r2r7 + r4(r7 + 1) + r7) - mr10(nr7(r2 + 2r4 + 1) - r3(r2 + 2(r4 + r7)))) -}{r10(r2(r4 + r7) + r3(r4 + r7) - (r4(r7 + 1) + r7)) - r3(r4(r7 + 1) + r7))) -}$ $\dfrac{r10r3(m(r2(r7 + 1) + 2(r4(r7 + 1) + r7)) - (r2r7 + r4(r7 + 1) + r7))}{r10(mnr7(r2 + 2r3) + nr4r7(r2 + 2r3) - (r4(r7 + 1) + r7)(r2 + r3))}$ 51: "For symmetry, damping of numerator at 16dB boost = damping of denomonator"
52: "at 16dB cut, where $k = 1$ at 16dB boost and $k = k$ at 16dB cut:"

53: $\dfrac{k^2(mnr10r7 - (r4 + r7)(r10 + r3)) + k(mnr10r7(r2 + 2r3 - 1) - (nr4r7(2r10 + r2 + 2r3) +}{k^2(mnr10r7 - (r4 + r7)(r10 + r3)) - k(mnr10r7 + r10(r3(r4 + r7) -}$ $\dfrac{r10(r2(r4 + r7) + r3(r4 + r7) - (r4(r7 + 1) + r7)) - r3(r4(r7 + 1) + r7))) -}{(r4(r7 + 1) + r7)) - r3(r4(r7 + 1) + r7)) + r10r3(r4(r7 + 1) + r7)_*}$ $\dfrac{r10(mnr7(r2 + 2r3) + nr4r7(r2 + 2r3) - (r4(r7 + 1) + r7)(r2 + r3))}{} =$ $-\dfrac{mr10(r2 + 2r4)(n + r3) - (r2 + r4)(r10(r3 + 1) + r3)}{r4(r10(r3 + 1) + r3)}$

54: "=========================================="

| Derivation | FIG. 3 of Specification | Normalized Value | Practical Value (ohms) |
|---|---|---|---|
| R2 | 42, 44, 47, 51 (all identical values) | 0.3962 | 3.92 k ± 1% |
| R3 | 40 | 0.1282 | 1.27 k ± 1% |
| R4 | 48 | 0.1845 | 1.82 k ± 1% |
| R5 | 46 | 0.7133 | 7.15 K ± 1% |
| R6 | 43 | 0.2867 | 2.87 k ± 1% |
| R8 | 80 | 0.1820 | 1.82 k ± 1% |
| R9 | 90 | 0.1820 | 1.82 k ± 1% |
| (potentiometer; normalized to 1) | 70 | 1.0000 | 10 k |
| R7 | Mathematical parameter: sum of R5 and R6 | 1.0000 | — |
| R10 | Mathematical parameter: sum of R8 and R9 | 0.3640 | — |
| n | Parameter: R6/R7 | 0.2867 | — |
| m | Parameter: R9/R10 | 0.5 | — |

I claim:

1. An audio equalizer comprising:

a first operational amplifier coupled to receive an input audio signal;

a filter having its input coupled to the output of said first operational amplifier;

a second operational amplifier;

coupling means for coupling the output of said first operational amplifier to the input of said second operational amplifier;

a potentiometer coupled to the output of said filter;

a first resistor coupled between one end of said potentiometer and the input of said second operational amplifier so as to provide a positive feed-forward path;

a second resistor coupled between another end of said potentiometer and the input of said first operational amplifier so as to provide a negative feedback path;

a a resistance means for providing an attenuated signal coupled to said one end of said potentiometer, said attenuated signal being applied to the input of said second operational amplifier so as to provide a negative feed-forward path.

2. The equalizer defined by claim 1 wherein movement of said potentiometer in a first direction provides more signal in said first resistor, less signal in said second resistor and less signal in said resistance means and wherein movement of said potentiometer in a second direction provides less signal in said first resistor, more signal in said second resistor and more signal in said resistance means.

3. The equalizer defined by claim 2 wherein said filter is a band pass filter.

4. The equalizer defined by claim 2 wherein said resistance means is a pair of resistors.

5. An audio equalizer comprising:
an input line for receiving an input audio signal;
a filter having an input coupled to receiver said input audio signal from said input line;
a positive feed-forward path for coupling the output of said filter to said input audio signal such that said output of said filter is combined with said input audio signal;
a positive feedback path for coupling said output of said filter to said input audio signal such that said output of said filter is combined with said input audio signal;
a negative feedback path for coupling said output of said filter to said input audio signal such that said output of said filter is subtracted from said input audio signal;
a negative feed-forward path for coupling said output of said filter to said input audio signal such that said output of said filter is subtracted from said input audio signal; and,
a potentiometer coupled to said output of said filter such that movement of said potentiometer in a first direction provides an increased signal in said positive feedback and positive feed-forward paths and a decrease in signal in said negative feedback and negative feed-forward paths and movement of said potentiometer in a second direction provides less signal in said positive feedback and positive feed-forward paths and more signal in said negative feedback and negative feed-forward paths.

6. The audio equalizer defined by claim 5 wherein said filter is a band pass filter.

7. The audio equalizer defined by claim 6 wherein said potentiometer has a grounded center tap.

8. The audio equalizer defined by claim 7 including current limiting means for limiting the current from said filter.

9. An audio equalizer comprising:
a first operational amplifier coupled to receive an input audio signal; at one of the in terminal;
a filter having its input coupled to the output of said first operational amplifier;
a second operational amplifier;
coupling means for coupling the output of said first operational amplifier and a first input of said second operational amplifier;
a potentiometer coupled to the output of said filter;
a first resistor coupled between one end of said potentiometer and a first input of said second operational amplifier so as to provide a positive feed-forward path;
a second resistor coupled between another end of said potentiometer and said first operational amplifier so as to provide a negative feedback path;
a third resistor coupled between said one end of said potentiometer and the first input of said first operational amplifier so as to provide a positive feedback path; and,
a resistance means for providing an attenuated signal coupled to said another end of said potentiometer and said second amplifier, said attenuated signal being applied to the input second of said second operational amplifier so as to provide a negative feed-forward path.

10. The equalizer defined by claim 9 wherein movement of said potentiometer in a first direction provides more signal in said first and third resistors, less signal in said second resistor and less signal in said resistance means and wherein movement of said potentiometer in a second direction provides less signal in said first and third resistors, more signal in said second resistor and more signal in said resistance means.

11. The equalizer defined by claim 10 wherein said filter is a band pass filter.

12. The equalizer defined by claim 11 wherein said potentiometer is a center tap potentiometer, said center tap being coupled to ground.

13. The equalizer defined by claim 12 including current limiting means for limiting the current from said filter.

14. The equalizer defined by claim 13 wherein said resistance means is a pair of resistors.

15. An audio equalizer comprising:
a first amplifier coupled to receive an input audio signal;
a band pass filter coupled to the output of said first amplifier;
a second amplifier having its input coupled to the output of said first amplifier;
a positive feed-forward path for coupling the output of said filter to the input of said second amplifier;
a positive feedback path for coupling the output of said filter to the input of said first amplifier;
a negative feedback path for coupling the output of said filter to the input of said first amplifier;
a negative feed-forward path for coupling the output of said filter to the input of said second amplifier; and,
a potentiometer for adjusting the amount of signal in said positive feedforward, positive feedback, negative feedback and negative feed-forward paths.

* * * * *

UNITED STATES PATENT AND TRADEMARK OFFICE
CERTIFICATE OF CORRECTION

PATENT NO. : 5,282,252
DATED : Jan. 25, 1994
INVENTOR(S) : Robert A. Orban

It is certified that error appears in the above-indentified patent and that said Letters Patent is hereby corrected as shown below:

Column 4, Line 45;    Delete "resistor";    Insert in place thereof -- resistors--

Column 4, Line 68;    Delete ";";    Insert in place thereof --:--

Column 12, Line 19;    Delete "second" after "input"

Column 12, line 19, after "the" insert —second—

Column 11, line 56, "in terminal" should read —input terminals—

Signed and Sealed this

Seventh Day of November, 1995

Attest:

BRUCE LEHMAN

Attesting Officer    Commissioner of Patents and Trademarks